(12) United States Patent
Jang

(10) Patent No.: US 6,320,752 B1
(45) Date of Patent: Nov. 20, 2001

(54) FIXING APPARATUS FOR A MOUNTING TYPE CARD MEMBER

(75) Inventor: Chung Gui Jang, Pyungtaek (KR)

(73) Assignee: LG Electronics, Inc., Seoul (KR)

( * ) Notice: Subject to any disclaimer, the term of this patent is extended or adjusted under 35 U.S.C. 154(b) by 0 days.

(21) Appl. No.: 09/323,224

(22) Filed: Jun. 1, 1999

(30) Foreign Application Priority Data

Sep. 10, 1998 (KR) .................................................. 98/37325

(51) Int. Cl.⁷ ....................................................... H05K 5/00
(52) U.S. Cl. ........................ 361/740; 361/741; 361/747; 361/756; 361/759; 361/801; 361/802
(58) Field of Search ..................................... 361/726, 731, 361/732, 740, 741, 747, 748–756, 759, 800, 801, 802; 312/223.1, 265.1; 439/64, 377

(56) References Cited

U.S. PATENT DOCUMENTS 5,757,618 * 5/1998 Lee ........................................ 361/686
5,936,835 * 8/1999 Astier .................................... 361/683
5,947,571 * 9/1999 Ho ....................................... 312/265.6

* cited by examiner

*Primary Examiner*—Jeffrey Gaffin
*Assistant Examiner*—Phuong T. Vu
(74) *Attorney, Agent, or Firm*—Birch, Stewart, Kolasch & Birch, LLP

(57) ABSTRACT

The present invention relates to a fixing apparatus for a mounting type card member which is capable of implementing an easier installation of an option card in a computer main chassis without using any tools. In the computer casing, there are provided a main chassis having a bracket having a fixing portion, and a motherboard engaged to the main chassis and having one or more slots, the card members having a connector portion connected with the slot and a bracket formed at one end of the same. A fixing member has a body portion which supports the card member bracket and fixing portions formed at both ends of the body portion, whereby the fixing portions are fixed to the fixing portion of the main chassis, and the body portion contacts with the bracket of the card members for thereby preventing a movement or escape of the card members.

7 Claims, 5 Drawing Sheets

FIXING APPARATUS FOR A MOUNTING TYPE CARD MEMBER

BACKGROUND OF THE INVENTION

1. Field of the Invention

The present invention relates to an apparatus for fixing option or expansion cards or circuit boards when installing the same into a main body(also called a "motherboard" or a "back plane") of a personal computer and the like, and in particular to a fixing apparatus for a mounting type card member which enables an easier mounting operation without requiring an additional tool for fixing an option card into a computer main chassis.

2. Description of the Background Art

FIG. 1 is an exploded perspective view illustrating the internal structure of a typical conventional desktop personal computer. The structure in which an option card is installed into a computer main chassis will be explained with reference to FIG. 1.

Generally, an option card 10 represents a data processing apparatus such as an internal type communication MODEM, a printer connection card, a TV signal receiving card, a sound card, etc. which is capable of providing a computer with an optional function and is installed on a motherboard 20 installed in a computer main chassis 1.

The above-described option card 10 generally includes a card bracket 15 provided at one end of the option card 10 which includes a bent plate 12 having a hole 11 therein, and an insertion plate 13 formed at a lower side of the option card 10 insertable into a card position determining slot 25 in the computer main chassis 1.

In the interior of the computer main chassis 1, a main chassis bracket 30 is installed at a side of the computer main chassis 1 extending in a direction perpendicular to the motherboard 20. A plurality of engaging grooves 31 are formed at the main chassis bracket 30 at a regular interval for thereby engaging a plurality of the option cards 10 thereto. A screw hole 32 is formed between each of the neighboring option cards 10 for fixing the option cards 10 using a corresponding screw 40 through the hole 11 formed in the card bracket 15.

A card position determining slot 25 is formed either in the main chassis bracket 30 or the motherboard 20 below the engaging groove 31 for thereby determining the position of the option card 10 in a state that the insertion plate 13 of the card bracket 15 of the option card 10 is inserted thereinto.

In the drawings, reference numeral 22 designates expansion slots mounted on the motherboard 20 into which the optical cards 10 are engaged, 10a designates a card edge connector of the option card 10 which is inserted into a corresponding expansion slot 22 for electrically connecting the option card 10 and the motherboard 20.

With reference to the above-described conventional structure for fixing the option card, the operation for fixing the option card will be explained.

First, the connector 10a of an option card 10 is engaged in an expansion slot 22 of the motherboard 20, and the insertion plate 13 of the option card bracket 15 is inserted into the corresponding card position determining slot 25 of the motherboard 20. The hole 11 in the option card bracket 15 and the screw hole 32 in the main chassis bracket 30 are aligned. Thereafter, a screw 40 is fastened using a driver tool for thereby fixing the option card 10.

In order to change or remove the option card 10, the above-described operation is performed in the reverse sequence.

In the above-described conventional option card fixing structure, the option card 1 is inserted into a portion of the motherboard 20, and the option card bracket 15 is fixed to the main chassis bracket 30 using the screw 40.

However, in the above-described conventional option card fixing structure, since the option cards are installed into the computer main chassis using screws, a certain tool such as a screw driver must be used for installing the option cards using the screws, thereby causing much inconvenience.

In addition, when engaging the screws, if the screws are dropped onto the motherboard, it is difficult to find and retrieve the screws. If the screws are dropped into a portion between the motherboard and the main chassis, the motherboard must be disassembled in order to retrieve the dropped screws. If the screws are missing, it is impossible to fix the option card.

SUMMARY OF THE INVENTION

Accordingly, it is an object of the present invention to provide a fixing apparatus for a mounting type card member which is capable of easily fixing an option card using an option card fixing member without needing an additional tool for fixing the optical card.

To achieve the above objects, there is provided a fixing apparatus or a mounting type card member in a computer which includes a main chassis having a bracket having a fixing portion, a motherboard being engaged to the main chassis and having one or more slots, the card members each having a connector portion to be connected with the slot and a bracket formed at one end of the same. A fixing member has a body portion which supports the bracket of the card members and fixing portions formed at both ends of the body portion, whereby when the fixing portion is fixed to the fixing portion of the main chassis, the body portion contacts with the bracket of the card member for thereby preventing a movement or escape of the card member.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The fixing apparatus for a mounting type card member according to the present invention will be explained with reference to the accompanying drawings.

Figure 1:
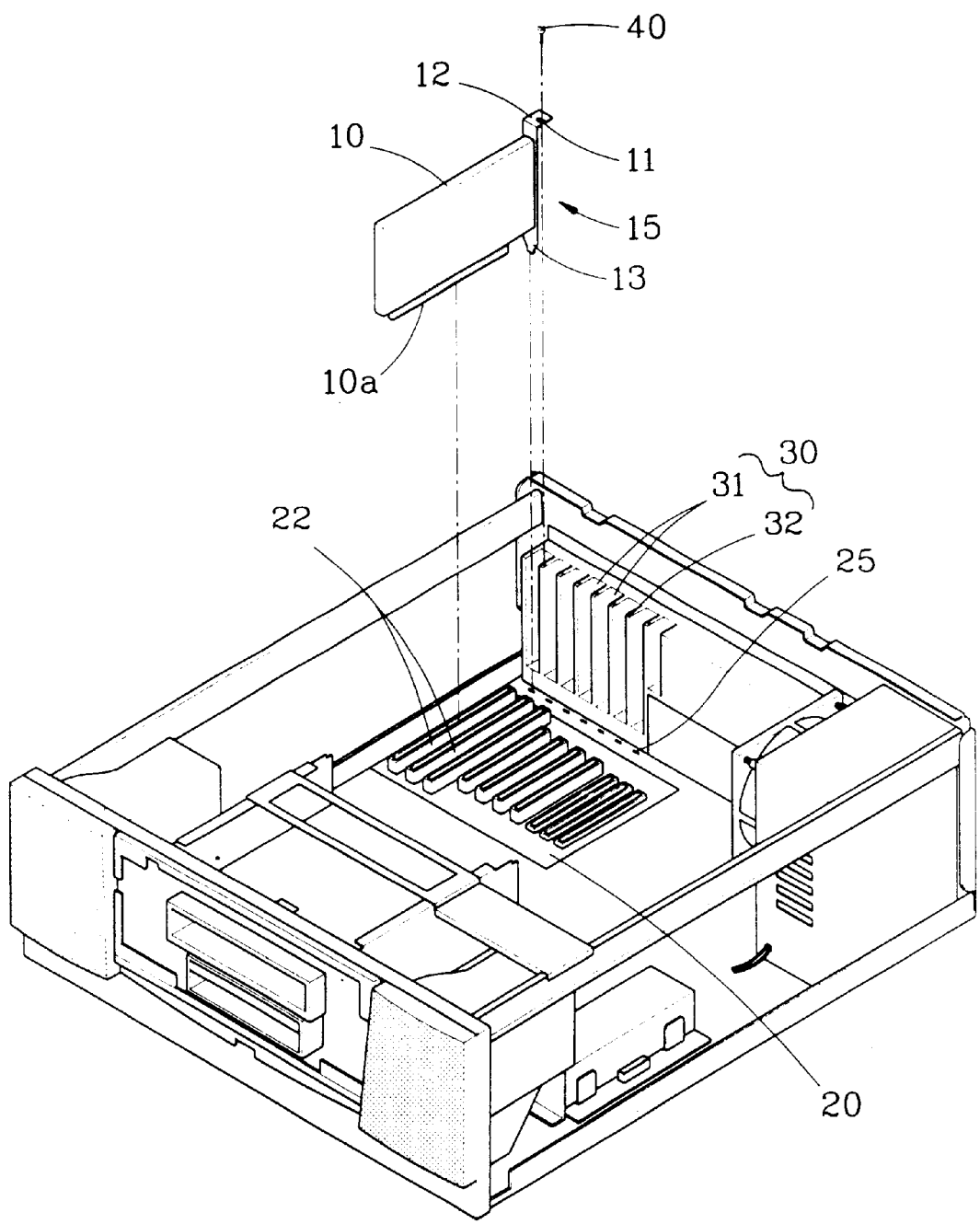
FIG. 1 is an exploded perspective view illustrating a computer main chassis having a conventional option card fixing structure.
Figure 2:
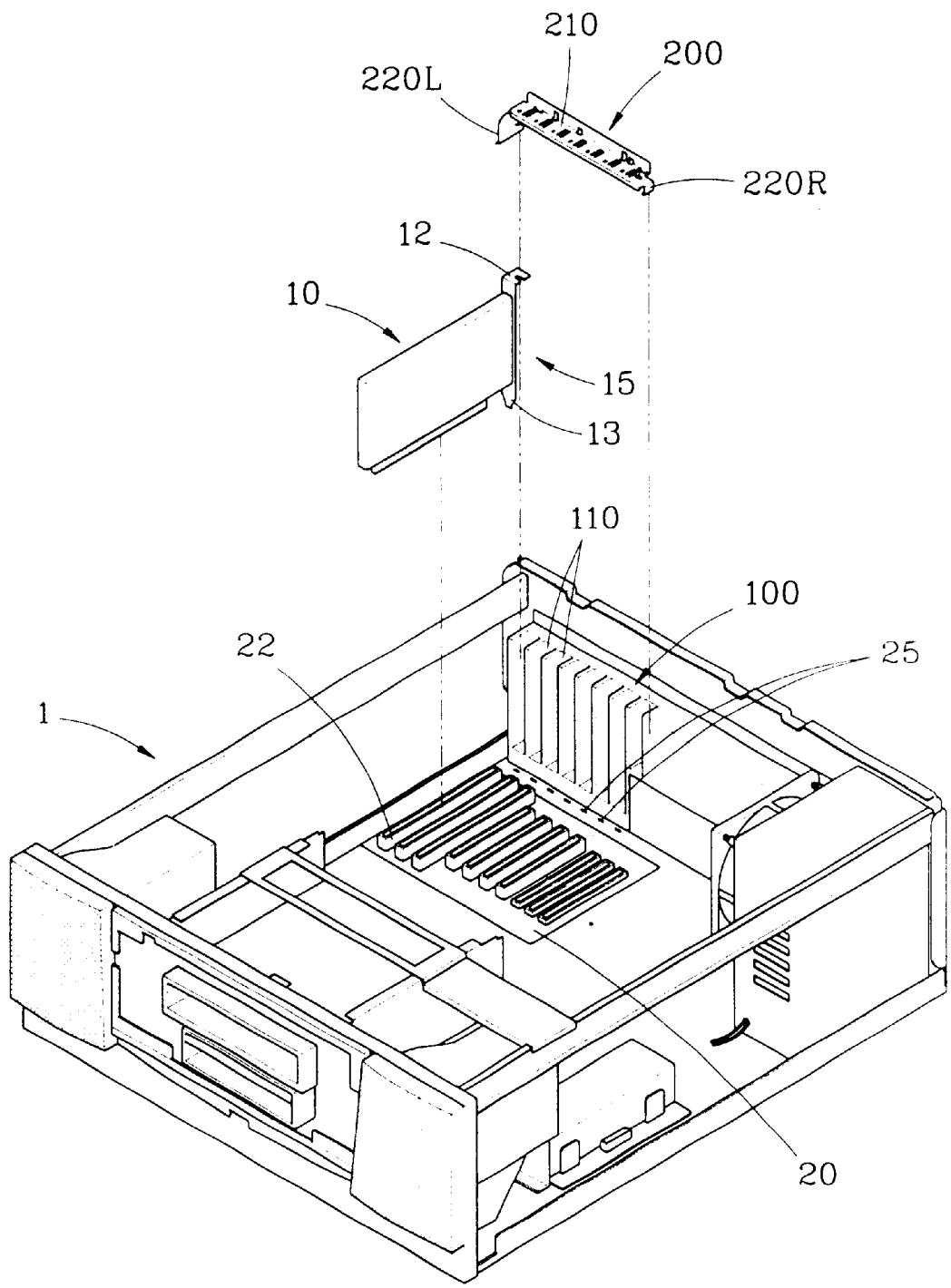
FIG. 2 is an exploded perspective view illustrating a computer main chassis having an option card fixing member according to the present invention.

FIG. 2 is an exploded perspective view illustrating a desktop personal computer main chassis in which a fixing apparatus for a mounting type card member according to the present invention is provided. The elements which are the same as in the conventional art are given the same reference numerals.

In the fixing apparatus for a card member according to the present invention, a longitudinal fixing bracket 200 is installed for elastically supporting an upper portion of a card bracket 15 of an option card 10 installed at a main chassis bracket 100 of a computer main chassis 1.

Since the fixing apparatus for a mounting type card member according to the present invention is adapted to a conventionally used option card 10, the construction of the option card 10 is the same as in the conventional art. Therefore, the description thereof will be omitted.

Figure 3:
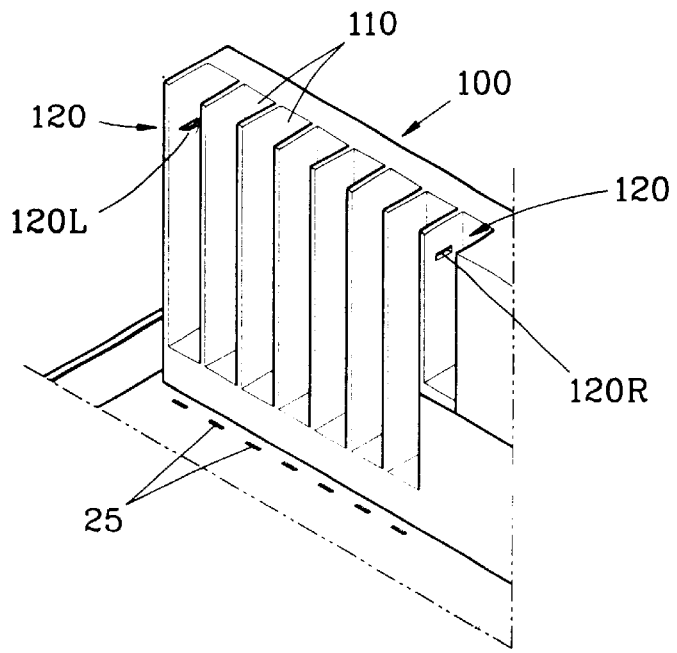
FIG. 3 is a partial perspective view illustrating a main chassis racket according to the present invention.

FIG. 3 illustrates the main chassis bracket 100 in more detail.

A plurality of engaging slots 110 are formed in the main chassis bracket 100 at regular intervals for installing a plurality of option cards 10 therein. A fixing portion 120 having a recess 120L is formed at one end of the main chassis bracket 100, and a fixing hole 120R is formed at the other end of the same. A card position determining slot 25 into which an insertion plate 13 of an option card 10 can be inserted is formed either in the main chassis bracket 100 or in the motherboard 20 below each engaging slot 110.

As shown in FIG. 3, in the fixing portion 120 of the main chassis bracket 100, the recess 120L includes a rounded recess at its wall, and the fixing hole 120R is formed at the other side in a slotted shape.

Figure 4:
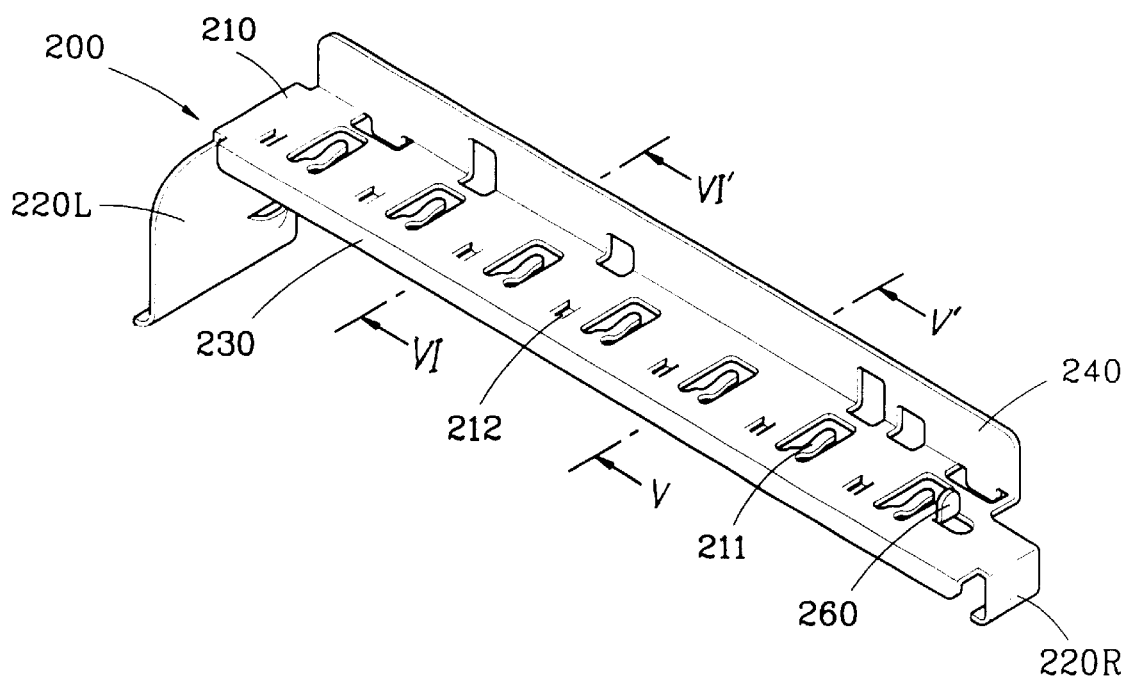
FIG. 4 is a perspective view illustrating a fixing bracket according to the present invention.
Figure 5:
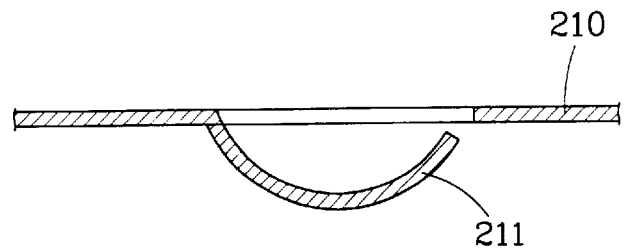
FIG. 5 is a cross-sectional view taken along line V–V' of FIG. 3.
Figure 6:
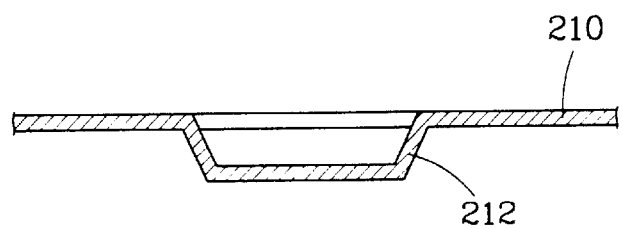
FIG. 6 is a cross-sectional view taken along line VI–VI' of FIG. 3.
Figure 7:
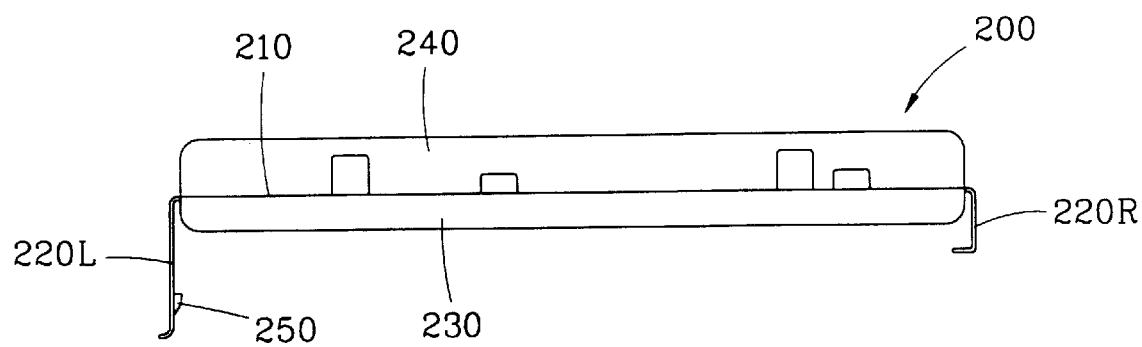
FIG. 7 is a front view illustrating a fixing portion of an option card bracket according to the present invention.

FIG. 4 is a perspective view illustrating the fixing bracket, FIGS. 5 and 6 are cross-sectional views taken along lines V–V' and VI–VI' in FIG. 4, and FIG. 7 is a front view of the fixing bracket shown in FIG. 4.

As shown therein, the fixing bracket 200 includes planner rectangular shaped longitudinal body portion 210 in which a plurality of downwardly curvedly bent pressing protrusions 211 each of which has a cut-away portion for elastically supporting a corresponding bent plate 12 of an option card 10 as shown in FIG. 5 are formed at intervals in the longitudinal direction of the fixing bracket 200, and a plurality of movement prevention protrusions 212 are also formed therein for thereby preventing the movement of the option card bracket 15 at each side of each pressing protrusion 211 as shown in FIG. 6.

In addition, there are provided respective fixing portions 220R and 220L which are downwardly extended and at respective ends of the body portion 210 to be fixed at respective end portions of the main chassis bracket 100, an engaging portion 230 which is downwardly bent at the front edge of the body portion 210 for preventing movement of the option card bracket 15 in the front and rear directions, and a support portion 240 which is upwardly and downwardly bent at the back portion of the body portion 210 to be supported against the computer main chassis 1.

As shown in FIG. 7, the fixing portion 220L has its lower portion bent outwardly, and includes a rounded protrusion 250 at the inner side, and the rounded protrusion 250 being insertable and fixable to the recess 120L in the main chassis bracket 100.

The other fixing portion 220R is formed in a hook shape and is insertable into the fixing hole 120R in the main chassis bracket 100.

As shown in FIG. 4, an upwardly bent tab 260 may be formed at the body portion 210 so that the body portion 210 is detachable from the main chassis bracket 100 at the end of the fixing portion 220R.

The operation by which an option card is fixed by the fixing apparatus of the mounting type card member according to the present invention will next be explained with reference to the accompanying drawings.

The connector 10a of an option card 10 is engaged into a corresponding expansion slot 22 of the motherboard, and the insertion plate 13 of the option card bracket 15 is inserted into the corresponding card position determining slot 25, so that the bent plate 12 of the option card bracket 15 is positioned on the upper surface of the main chassis bracket 100.

In this state, the fixing portion 220R of the fixing bracket 200 is inserted into the fixing hole 120R of the main chassis bracket 100, and the fixing portion 220L of the fixing bracket 200 is pushed in the direction of the recess 120L of the main chassis bracket 100, and the rounded protrusion 250 formed at the fixing portion 220L is slidably inserted into the recess 120L of the main chassis bracket 100, so that the option card 10 is engaged into the computer main chassis 1.

The bent plate 12 which is formed at the upper portion of the option card bracket 15 is elastically supported by the downwardly curvedly bent pressing protrusion 211 of the body portion 210 for preventing any upward and downward movement of the option card bracket 15 and also for providing metal-to-metal contact for electrically grounding the option card bracket 15 to the chassis. In addition, leftward or rightward movement of the option card bracket 15 is prevented by the movement prevention protrusions 212 formed at both sides of the pressing protrusion 211. In addition, forward or backward movement of the option card bracket 15 is prevented by the engaging portion 230 of the fixing bracket 200, so that the option card 10 is stably fixed to the motherboard 20 of the computer main chassis 1.

The operation by which the fixing bracket 200 is removed when changing an option card 10 or installing another option card will next be explained.

The protrusion 250 is released from the recess 120L by lifting up the fixing portion 220L having the rounded protrusion 250, and the fixing portion 220R is released from the fixing hole 120R, so that the fixing bracket 200 is separated from the main chassis bracket 100.

Figure 8:
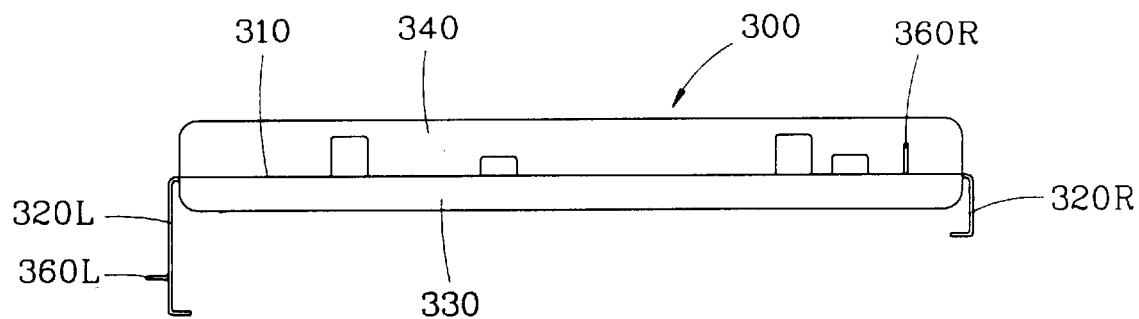
FIG. 8 is a front view illustrating a fixing portion of a different type option card bracket according to the present invention.

FIG. 8 illustrates a fixing bracket 300 having a different structure of the fixing portion. As shown therein, downwardly bent fixing portions 320R and 320L are provided at opposite ends of a body portion 310 from each other and are bent in a hook shape, and a tab 360L is formed at one side of the fixing portion 320L.

A tab 360R is formed at the body portion 310 at the side of the fixing portion 320R and is opposite to the knob 360L.

An engaging portion 330 is downwardly bent at the edge of the body portion 310 for preventing forward and backward movement of the option card bracket 15, and a support lip portion 340 is upwardly bent at the back edge of the body portion 310 to be supported against the computer main chassis 1.

Figure 9:
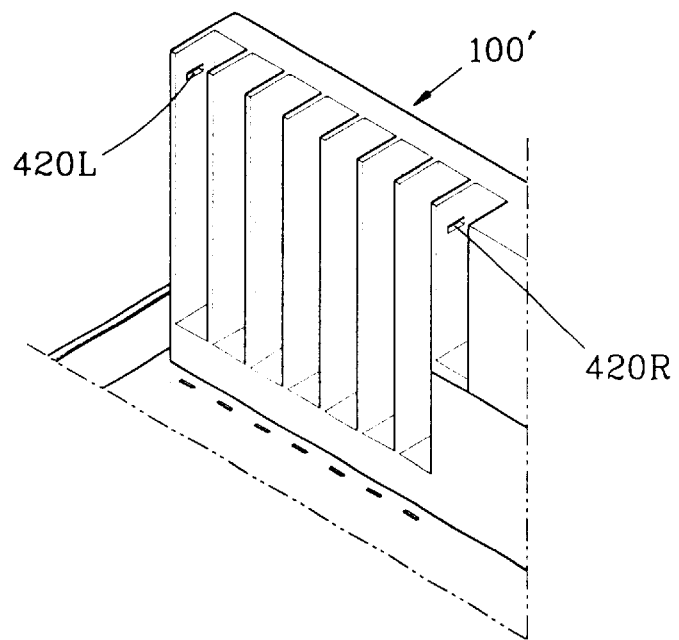
FIG. 9 is a perspective view illustrating a main chassis bracket based on a different type option card bracket according to the present invention.

In the case of the fixing bracket 300 having fixing portions 320R and 320L, as the fixing portion of the main chassis bracket 100' into which the fixing portions 320R and 320L are inserted, there are provided slotted fixing holes 420R and 420L as shown in FIG. 9.

The option card fixing operation which is implemented by an option card fixing member having the fixing portions 320R and 320L will next be explained.

The connector 10a of the option card 10 is engaged into the expansion slot 22 of the mother body 20, and the insertion plate 13 of the option card bracket 15 is inserted into the card position determining slot 25 of either the chassis bracket 100' or the motherboard 20, and the bent plate 12 of the option card bracket 15 is positioned on the upper surface of the main chassis bracket 100.

In this state, the fixing portion 320R of the fixing bracket 300 is inserted into the fixing hole 420R in the main chassis bracket 100, and the fixing portion 320L of the fixing bracket 300 is pushed in the direction of the main chassis bracket 100', and the fixing portion 320L is inserted into the fixing hole 420L in the main chassis bracket 100', so that the option card 10 is stably engaged to the main computer chassis 1.

When changing the option card 10 or installing another option card, the fixing bracket 300 is separated as follows.

The tab 360L of the fixing portion 320L is lifted up, so that the fixing portion 320L is separated from the fixing hole 420L in the main chassis bracket 100'. Thereafter, the fixing portion 320R is separated from the fixing hole 420R by holding the opposite tab 360R, so that the fixing bracket 300 is separated from the main chassis bracket 100'.

As described above, in the fixing apparatus for a mounting type card member according to the present invention, an option card is installed using a fixing member without needing any special fasteners such as screws or a screw driver, for thereby implementing an easier installation of the option cards, whereby it is possible to implement a simple construction of the computer system and enhance an option card installation workability for the user.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A fixing apparatus for a mounting type card member, comprising;

a main chassis bracket positioned at one side of a computer main chassis and having one or more engaging slots;

a motherboard engaged to the computer main chassis and having one or more expansion slots;

a card member having a connector insertable in the expansion slot of the mother board and having a card bracket positionable in the engaging slot of the main chassis bracket; and a fixing member having a body portion which supports the card bracket of the card member and having fixing portions formed at both ends of the body portion for fixing to the main chassis bracket;

wherein the main chassis bracket has one or more card position determining portions in which an end portion of the card bracket may be engaged; and wherein the body portion of the fixing member includes;
(a) one or more pressing protrusions which press the card member in a direction toward the card position determining portion of the main chassis bracket for preventing upward or downward movement of the card member;
(b) one or more movement preventing protrusions formed at each side of the pressing protrusion for preventing lateral movement of the card member; and
(c) an engaging portion for preventing movement of the card member in a longitudinal direction of the expansion slot of the mother board; and wherein engaging means are formed at the fixing portions of the fixing member and at the main chassis bracket, to enable the fixing member to be fixed to the main chassis bracket without a fastener.

2. The apparatus of claim 1, wherein said pressing protrusion has a cut-away portion and is downwardly and elastically bent in a curved shape.

3. The apparatus of claim 1, wherein said pressing protrusion is outwardly protruded from the body portion of the fixing member.

4. The apparatus of claim 1, wherein the fixing portions of the fixing member are extendedly bent in both directions of the main chassis bracket from ends of the body portion of the fixing member.

5. The apparatus of claim 4, wherein said one side of the fixing portions is formed with a rounded protrusion, and the main chassis bracket is formed with a fixing recess for receiving the rounded protrusion therein.

6. The apparatus of claim 4, wherein said one side of the fixing portions is formed with a hook shaped protrusion, and the main chassis bracket is formed with a fixing hole for receiving the hook shaped protrusion therein.

7. The apparatus of claim 4, wherein said one side of the fixing portions is formed with a rounded protrusion, the other side of the fixing portions is formed with a hook shaped protrusion, and one side of the main chassis bracket is formed with a fixing recess for receiving the rounded protrusion thereinto and the other side of the main chassis is formed with a fixing hole for receiving the hook shaped protrusion thereinto.

* * * * *